(12) United States Patent
Kunikiyo

(10) Patent No.: US 6,429,105 B1
(45) Date of Patent: Aug. 6, 2002

(54) METHOD OF MANUFACTURING SEMICONDUCTOR DEVICE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/612,960

(22) Filed: Jul. 10, 2000

(30) Foreign Application Priority Data

Jan. 13, 2000 (JP) .......................................... 2000-004687

(51) Int. Cl.[7] .......................................... H01L 21/3205
(52) U.S. Cl. ....................... 438/586; 438/783; 438/633; 438/723
(58) Field of Search .................................. 438/586, 783, 438/787, 788, 633, 643, 683, 658, 700, 725, 723, 659, 692

(56) References Cited

U.S. PATENT DOCUMENTS

| | | | |
|---|---|---|---|
| 5,990,007 A | 11/1999 | Kajita et al. | 438/680 |
| 6,103,601 A | * 8/2000 | Lee et al. | |
| 6,136,680 A | * 10/2000 | Lai et al. | |
| 6,200,651 B1 | * 3/2001 | Roche et al. | |

FOREIGN PATENT DOCUMENTS

| | | |
|---|---|---|
| CN | 358965 | 5/1999 |
| JP | 9-153472 | 6/1997 |
| JP | 10-98011 | 4/1998 |
| JP | 10-242028 | 9/1998 |

* cited by examiner

*Primary Examiner*—Caridad Everhart
(74) *Attorney, Agent, or Firm*—Oblon, Spivak, McClelland, Maier & Neustadt, P.C.

(57) ABSTRACT

A method of manufacturing a semiconductor device is provided. A TEOS film (1) is formed, and then an FSG film (2) is formed on the TEOS film (1) by a CVD or PVD process. The CVD or PVD of the FSG film (2) is continued so that noble gas atoms are introduced into the FSG film (2) to form a noble gas atom containing layer (3). Next, using a photoresist (4) formed on the noble gas atom containing layer (3) as a mask, the noble gas atom containing layer (3) and the FSG film (2) are etched in the order named. After the photoresist (4) is removed, a barrier metal (6) and a copper film (7) are formed on an entire surface of a resultant structure. The copper film (7) and the barrier metal (6) are polished away in the order named by a CMP process until an upper surface of the noble gas atom containing layer (3) is exposed. Parts of the copper film (7) which are left unpolished become copper interconnect lines (9) filling trenches (5). The method can reduce a wiring capacitance between the adjacent interconnect lines.

13 Claims, 11 Drawing Sheets

F I G. 1
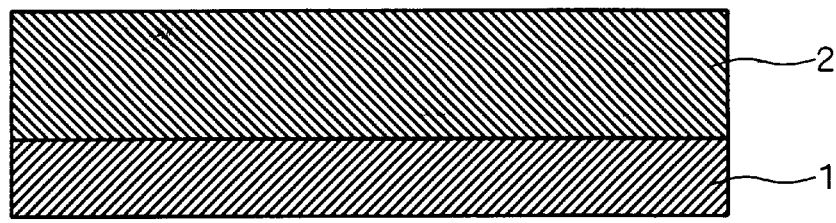
F I G. 2
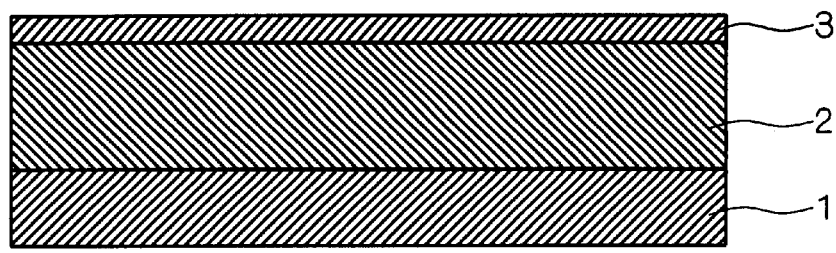
F I G. 3
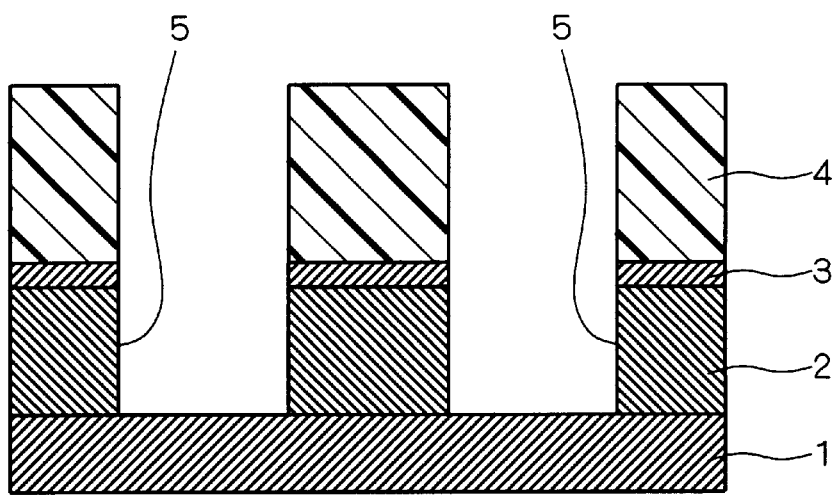

F/G. 23
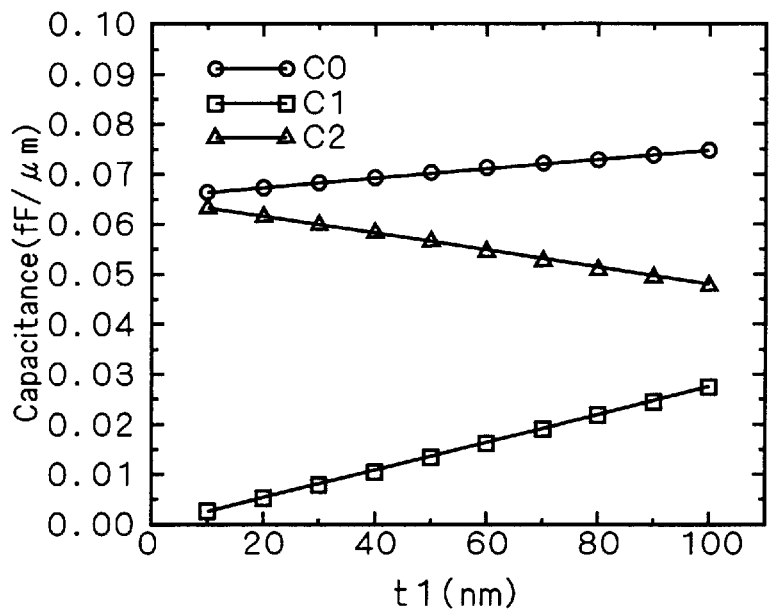
F/G. 24
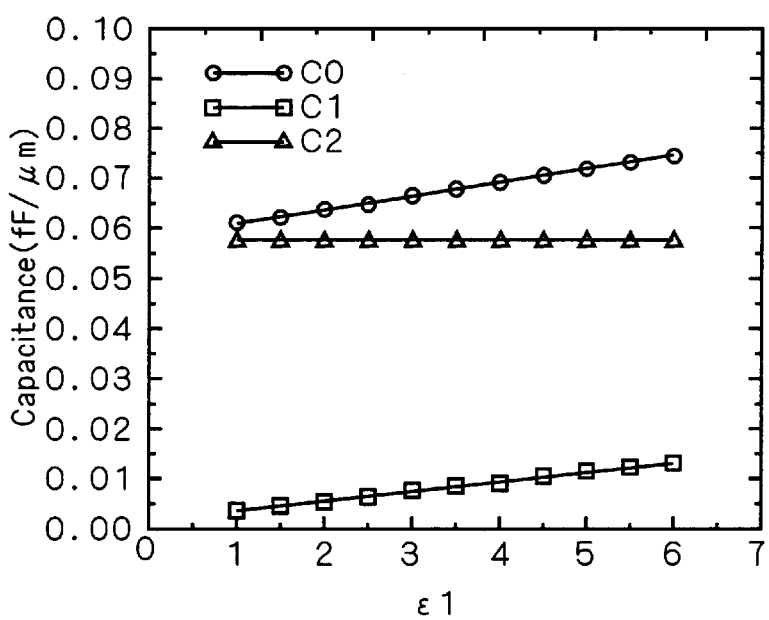

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of forming a metal interconnect line using a CMP (Chemical Mechanical Polishing) process. The invention relates also to a semiconductor device manufactured by the above-mentioned method.

2. Description of the Background Art

A semiconductor integrated circuit comprises a multiplicity of semiconductor devices formed on a main surface of a semiconductor substrate in a device formation region. The semiconductor devices are electrically isolated from each other by an isolating insulation film such as STI (Shallow Trench Isolation) formed in the main surface of the semiconductor substrate in an isolation region. To accomplish the function of the semiconductor integrated circuit, the semiconductor devices are electrically connected to each other by an electrical conductor such as an interconnect line.

The electrical conductor commonly used includes metal or heavily doped polysilicon. The material of the metal interconnect line is aluminum, copper, tungsten, molybdenum, or the like. The material of a gate electrode which is an interconnect line formed on the main surface of the semiconductor substrate is aluminum, polysilicon, a two-layer structure comprised of polysilicon and metal silicide, tungsten, molybdenum, or the like. Metal used for the metal silicide is tungsten, cobalt, nickel, titanium, zirconium, platinum, or the like.

With recently decreasing size of semiconductor integrated circuits, the operating speed of semiconductor devices has been dominated by the performance of multi-level interconnect lines, rather than the performance of MOS transistors themselves, since a 0.18-$\mu$m line width generation. In recent years, attention has accordingly been focused on a copper interconnect line having a resistivity lower than that of an aluminum interconnect line which has been a conventionally dominant metal interconnect line. At 20° C., copper has a resistivity of 1.70 $\mu\Omega$·cm, whereas aluminum has a resistivity of 2.74 $\mu\Omega$·cm.

Since aluminum is anisotropically etchable, a conventional process for forming an aluminum interconnect line comprises depositing an aluminum film on an entire wafer surface, forming a photoresist on the aluminum film by a photolithographic process, and anisotropically etching the aluminum film by using the photoresist as a mask. On the other hand, a technique for anisotropically etching copper has not yet been currently established. To form a copper interconnect line, a process known as a damascene process is employed which comprises anisotropically etching an interlayer insulation film to form a trench, forming a copper film on an entire surface of the interlayer insulation film so as to fill the trench by an electroplating or CVD process, and polishing away an excess part of the copper film which is formed on the interlayer insulation film by a CMP process to form a copper interconnect line in the trench.

FIG. 15 is a cross-sectional view of a background art semiconductor device comprising copper interconnect lines formed using the damascene process. A channel stopper 102 in the form of a layer is formed in a p-type semiconductor substrate 101. An STI 103 is formed in a main surface of the semiconductor substrate 1 in an isolation region. An nMOS transistor is manufactured in the semiconductor substrate 101 in a device formation region. The nMOS transistor comprises: a gate structure 106 selectively formed on the main surface of the semiconductor substrate 101 and having a multi-layer structure including a gate insulation film 104 and a gate electrode 105 formed on the gate insulation film 104; an insulation film 107 and a sidewall 108 which cover upper and side surfaces of the gate structure 106; and source/drain regions selectively formed in the main surface of the semiconductor substrate 101 and including n$^-$ type doped regions 109 of a relatively low concentration and n$^+$ type doped regions 110 of a relatively high concentration. A metal silicide 111 is formed on and in an upper surface of the doped regions 110.

An FSG (fluorosilicate glass) film 112 is formed on entire surfaces of the STI 103 and nMOS transistor, and a silicon nitride ($Si_3N_4$) film 113 is formed on an entire surface of the FSG film 112. Contact holes 114 extending from an upper surface of the silicon nitride film 113 to an upper surface of the metal silicide 111 are selectively formed in the FSG film 112 and the silicon nitride film 113. A barrier metal 115 is formed on a side surface of each of the contact holes 114, and a tungsten plug 116 is formed to fill each of the contact holes 114 with the barrier metal 115 formed on the side surface thereof.

An FSG film 117 is formed on an entire surface of the silicon nitride film 113, and a silicon oxynitride (SiON) film 118 is formed on an entire surface of the FSG film 117. Contact holes 119 extending from an upper surface of the silicon oxynitride film 118 to an upper surface of the tungsten plugs 116 are selectively formed in the FSG film 117 and the silicon oxynitride film 118. A barrier metal 120 is formed on side and bottom surfaces of each of the contact holes 119, and a copper interconnect line 121 is formed to fill each of the contact holes 119 with the barrier metal 120 formed on the side and bottom surfaces thereof. A silicon nitride film 122 is formed on an entire surface of the silicon oxynitride film 118.

A TEOS (tetraethylorthosilicate) film 123 is formed on an entire surface of the silicon nitride film 122, and an FSG film 124 is formed on an entire surface of the TEOS film 123. A silicon oxynitride film 125 is formed on an entire surface of the FSG film 124. A contact hole 126 extending from an upper surface of the silicon oxynitride film 125 to an upper surface of one of the copper interconnect lines 121 is selectively formed in the TEOS film 123, the FSG film 124 and the silicon oxynitride film 125. A barrier metal 127 is formed on side and bottom surfaces of the contact hole 126, and a copper interconnect line 128 is formed to fill the contact hole 126 with the barrier metal 127 formed on the side and bottom surfaces thereof. More specifically, part of the copper interconnect line 128 which lies below an upper surface of the TEOS film 123 functions as a copper plug for establishing an electric connection between the lower-level copper interconnect line 121 and part of the upper-level copper interconnect line 128 which lies above the upper surface of the TEOS film 123.

A trench 129 extending from the upper surface of the silicon oxynitride film 125 to a bottom surface of the FSG film 124 is selectively formed in the FSG film 124 and the silicon oxynitride film 125. A barrier metal 130 is formed on side and bottom surfaces of the trench 129, and a copper interconnect line 131 is formed to fill the trench 129 with the barrier metal 130 formed on the side and bottom surfaces thereof. A silicon nitride film 132 is formed on an entire surface of the silicon oxynitride film 125. The components ranging from a bottom surface of the TEOS film 123 to an upper surface of the silicon nitride film 132 serve as a single unit 133 of an interconnect layer. A protective film 134 is formed on an entire surface of the silicon nitride film 132.

The barrier metals 120, 127, 130 have the function of preventing copper atoms constituting the copper interconnect lines 121, 128, 131 from diffusing or drifting into the FSG films 117, 124 to degrade an insulating property.

A process for forming only the copper interconnect line 131 and the part of the copper interconnect line 128 which lies above the upper surface of the TEOS film 123 in the single interconnect layer unit 133 is known as a single damascene process. On the other hand, a process for forming the part of the copper interconnect line 128 which lies above the upper surface of the TEOS film 123 and the part of the copper interconnect line 128 which is below the upper surface of the TEOS film 123 (or the copper plug) in the same step is known as a dual damascene process. A method of forming the single interconnect layer unit by the single damascene process will be described below.

FIGS. 16 through 21 are cross-sectional views showing a method of manufacturing the background art semiconductor device in a step-by-step manner. First, the FSG film 124 is formed on the entire surface of the TEOS film 123 by a CVD or PVD process, and the silicon oxynitride film 125 is formed on the entire surface of the FSG film 124 by a CVD or PVD process (FIG. 16). The relative dielectric constants of these respective insulation films are as follows: the TEOS film 123 about 3.8–4.2, the FSG film 124 about 3.5–3.7, and the silicon oxynitride film 125 about 4.3–7.0. The relative dielectric constant of the silicon oxynitride film 125 increases with increasing nitrogen content. As a pitch between the interconnect lines decreases, a wiring capacitance between two adjacent interconnect lines in the same interconnect layer increases. Thus, the use of an insulation film having a lower relative dielectric constant (the FSG film 124 in this case) as the insulation film provided between adjacent interconnect lines reduces the wiring capacitance.

The silicon oxynitride film 125 is formed on the FSG film 124 to prevent an upper part of the FSG film 124 from being polished away during copper polishing in a subsequent CMP process. The decrease in thickness of the FSG film 124 due to the removal of the upper part thereof by polishing increases a wiring capacitance between different interconnect layers. However, this is prevented by forming the silicon oxynitride film 125 on the FSG film 124. In other words, the silicon oxynitride film 125 functions as a film for preventing polishing of the FSG film 124 during the copper polishing by the CMP process.

Next, a photoresist 136 having a predetermined opening pattern is formed on the silicon oxynitride film 125 by a photolithographic process. Using the photoresist 136 as a mask, an anisotropic dry etching process which exhibits a higher etch rate in a depth direction is performed to etch the silicon oxynitride film 125 and the FSG film 124 in the order named, exposing the upper surface of the TEOS film 123. As a result, the trenches 129 are formed each of which includes the side surface constructed of the silicon oxynitride film 125 and the FSG film 124 and the bottom surface constructed of the TEOS film 123, and has a depth 137 equal to the sum of the thicknesses of the silicon oxynitride film 125 and the FSG film 124 (FIG. 17). Under conditions of a higher etch selectivity between the FSG film and the TEOS film, etching can be stopped as soon as the upper surface of the TEOS film 123 is exposed. For etching under conditions of a lower etch selectivity therebetween, an etch time may be controlled in accordance with the sum of the thicknesses of the silicon oxynitride film 125 and the FSG film 124 to adjust the depth 137 of the trenches 129.

The photoresist 136 is removed, and then a barrier metal 138 is formed on the side and bottom surfaces of the trenches 129 and on the upper surface of the silicon oxynitride film 125 by a sputtering process or the like (FIG. 18). The material of the barrier metal 138 is tantalum (Ta), tantalum nitride (TaN), titanium nitride (TiN), tungsten nitride (WN), or the like.

A copper film 139 is formed on an entire surface of a resultant structure by an electroplating or CVD process. The copper film 139 fills the trenches 129 and is has an upper surface which is above the upper surface of the silicon oxynitride film 125 (FIG. 19).

Next, the copper film 139 and the barrier metal 138 are polished away in the order named by a CMP process until the upper surface of the silicon oxynitride film 125 is exposed. Parts of the copper film 139 which are left unpolished become the copper interconnect lines 131 filling the trenches 129. Parts of the barrier metal 138 which are left unpolished become the barrier metals 130 (FIG. 20).

The CMP process for copper comprises the following three basic steps:

(1) chemically producing a protective film for preventing copper etching on a surface of the copper film;

(2) physically removing only a raised part (on the atomic level) of the protective film by polishing using a polishing cloth; and (3) etching away, using a polishing agent, a raised part of copper which is exposed by the removal of the protective film.

As an example, the CMP process for copper using a glycine ($NH_2CH_2COOH$) base polishing agent is described below. First, a copper surface is oxidized by a hydrogen peroxide solution to provide a CuO film serving as an etch protection film. Only a raised part of the CuO film is physically removed by polishing using a polishing cloth, and thus exposed copper in the intermediate oxidation state ($Cu(H_2O)_4^{2+}$ or $Cu_2O$) reacts with glycine. The reaction of $Cu(H_2O)_4^{2+}$ and glycine is expressed as:

$$Cu(H_2O)_4^{2+} + 2NH_2CH_2COOH \rightarrow Cu(NH_2CH_2COOH)_2 + 4H_2O + 2H^+ \quad (1)$$

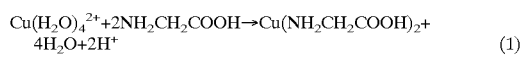

As given by the reaction formula (1), the reaction of copper in the intermediate oxidation state and glycine forms a copper-glycine complex. The copper-glycine complex is dissolved in water which is a by-product of the reaction. The silicon oxynitride film 125 serving as an underlying layer of the barrier metal 138 is removed little by an etchant used in the CMP process for the copper film 139.

Then, the silicon nitride film 132 is formed on an entire surface of a resultant structure to cover the copper interconnect lines 131 by a CVD process or the like (FIG. 21). The reason why the silicon nitride film 132 is formed is as follows: Decreasing the wiring resistance requires the prevention of surface oxidation of the copper interconnect lines 131 since CuO which is an oxide of copper is insulative. CuO is formed not only when copper is exposed to atmosphere but also when the copper surface is cleaned by an oxidizing cleaning fluid or when copper is polished in a CMP process. Therefore, it is desirable to reduce the thickness of the CuO film serving as the etch protection film, for example, in the CMP process for copper.

Unfortunately, such a background art method of manufacturing a semiconductor device presents problems to be described below.

First Problem

FIG. 22 is a schematic view for illustrating the wiring capacitance between two adjacent interconnect lines in the same interconnect layer in corresponding relation to the structure shown in FIG. 21. The thickness of the silicon oxynitride film 125 is designated by t1, and the relative dielectric constant thereof is designated by $\in 1$. The thickness of the FSG film 124 is designated by t2, and the relative dielectric constant thereof is designated by $\in 2$. A spacing between the left-hand and right-hand copper interconnect lines 131 shown in FIG. 22 is designated by d. The barrier metals 130 are regarded as part of the copper interconnect lines 131. The wiring capacitance between the two copper interconnect lines 131 shown in FIG. 22 is designated by C1 in a portion lying on opposite sides of the silicon oxynitride film 125 and by C2 in a portion lying on opposite sides of the FSG film 124. The total wiring capacitance C0 per unit length is expressed as:

$$C0=C1+C2=\in 1\in 0 t1/d+\in 2\in 0 t2/d \quad (2)$$

where $\in 0$ is a dielectric constant in a vacuum. The wiring capacitances C0, C1, C2 will be determined from Equation (2), for example, when $\in 1=6.0$, $\in 2=3.7$ and d=0.2. FIG. 23 is a graph showing plots of the wiring capacitances C0, C1, C2 versus the thickness t1 taking on various values when t1+t2 is fixed at 400 nm. The graph of FIG. 23 shows that the smaller the thickness t1 of the silicon oxynitride film 125, the lower the wiring capacitance C0. FIG. 24 is a graph showing plots of the wiring capacitances C0, C1, C2 versus the relative dielectric constant $\in 1$ assumed to take on various values when t1=50 nm and t2=350 nm. The graph of FIG. 24 shows that the smaller the relative dielectric constant $\in 1$ of the silicon oxynitride film 125, the lower the wiring capacitance C0.

From the above, it will be found desirable to use an insulation film made of a material resistant to copper polishing by the CMP process and having a low relative dielectric constant as the film for preventing polishing of the FSG film and yet to form the insulation film thinly on the FSG film in order to reduce the wiring capacitance between adjacent interconnect lines.

However, no insulation film which is as resistant to copper polishing as the silicon oxynitride film and which has a lower relative dielectric constant than does the silicon oxynitride film is known at the present time. Therefore, the silicon oxynitride film is optimum as the film for preventing polishing of the FSG film in the state of the art technology, and other than the technique of reducing the thickness of the silicon oxynitride film finds difficulties in further reducing the wiring capacitance between adjacent interconnect lines.

Second Problem FIG. 25 is a cross-sectional view of a semiconductor device manufactured by a background art semiconductor device manufacturing method and comprising the two levels of copper interconnect lines 121 and 128. The size reduction of the semiconductor device having a multi-level interconnection structure reduces the contact area of the upper-level copper interconnect line 128 (or barrier metal 127) and the lower-level copper interconnect lines 121 to inevitably increase an interface resistance. However, the semiconductor device manufactured by the background art semiconductor device manufacturing method presents such a problem that the interface resistance increases by an amount greater than the amount of increase resulting from the reduction in contact area.

Known causes for such a phenomenon include a foreign material which is produced by the reaction of an etching gas used to etch the silicon nitride film 122 and the copper interconnect lines 121 and is present at a contact interface, and a copper oxide film having a high insulating property (a CuO film 140 shown in FIG. 25) which is present in the upper surface of the copper interconnect lines 121. The CuO film 140 is formed by natural oxidation of the upper surface of the copper interconnect lines 121 between the step of forming the copper interconnect lines 121 and the step of forming the silicon nitride film 122 or is formed when the CuO film used as the etch protection film for the copper interconnect lines 121 in the CMP process is left in the upper surface of the copper interconnect lines 121. The CuO film 140 has a thickness ranging from about tens of nanometers to about hundreds of nanometers. However, the greater the amount of overpolishing of the copper film in the CMP process, the greater the amount of remaining CuO film as the etch protection film and accordingly the thicker the CuO film 140. The thicker the CuO film 140, the higher the interface resistance and the wiring resistance itself because of a smaller cross-sectional area of the copper interconnect lines 121.

This problem is solved by cleaning away the CuO film 140 exposed at the bottom surface of the contact hole before forming the upper-level barrier metal 127. However, the CuO film 140 is not sufficiently cleaned and accordingly is not completely removed in practice because of the small diameter of the contact hole, in particular, in a size-reduced semiconductor device.

SUMMARY OF THE INVENTION

A first aspect of the present invention is intended for a method of manufacturing a semiconductor device. According to the present invention, the method comprises the steps of: (a) forming an insulation film on an underlying layer, the insulation film including a noble gas atom containing layer in an upper surface thereof, the noble gas atom containing layer containing a noble gas atom; (b) selectively removing the insulation film until the underlying layer is exposed to form a trench; (c) forming a metal film on a structure resulting from the step (b); and (d) polishing away the metal film until the upper surface of the insulation film is exposed.

Preferably, according to a second aspect of the present invention, in the method of the first aspect, the insulation film is formed by deposition in the step (a); and the noble gas atom containing layer is formed by introducing the noble gas atom into the insulation film during the deposition of the insulation film.

Preferably, according to a third aspect of the present invention, in the method of the first or second aspect, the insulation film contains a fluorine atom. The method further comprises the steps of: (e) releasing from the insulation film the fluorine atom contained in part of the insulation film which is near a side surface thereof exposed by formation of the trench, the step (e) being performed between the steps (b) and (c); and (f) forming a barrier metal on the side surface of the insulation film and an upper surface of the underlying layer which are exposed by the formation of the trench, the step (f) being performed between the steps (e) and (c), wherein the metal film is formed on the barrier metal in the step (c).

Preferably, according to a fourth aspect of the present invention, in the method of the third aspect, the step (e) is performed by heat-treating a structure resulting from the step (b).

A fifth aspect of the present invention is intended for a method of manufacturing a semiconductor device. According to the present invention, the method comprises the steps of: (a) selectively forming a first metal interconnect line in an upper surface of a first insulation film; (b) forming a second insulation film on the first insulation film; (c) selectively trenching an upper surface of the second insulation film to form a trench, thereby exposing an upper surface of the first metal interconnect line; (d) introducing an impurity into the upper surface of the first metal interconnect line; (e) cleaning the upper surface of the first metal interconnect line, the step (e) being subsequent to the step (d); (f) forming a metal film on a structure resulting from the step (e); and (g) polishing away the metal film until the upper surface of the second insulation film is exposed to form a second metal interconnect line.

Preferably, according to a sixth aspect of the present invention, in the method of the fifth aspect, the impurity includes noble gas atoms; and the step (d) is performed by ion-implanting the noble gas atoms at an energy of 5 to 30 keV and at a dose of $1 \times 10^{13}$ to $1 \times 10^{15}/cm^2$.

Preferably, according to a seventh aspect of the present invention, in the method of the fifth aspect, the impurity is introduced also into a side surface of the second insulation film exposed by formation of the trench in the step (d); and the impurity introduced is selected from the group consisting of silicon, oxygen and ozone.

Preferably, according to an eighth aspect of the present invention, in the method of the fifth aspect, the impurity is introduced also into a side surface of the second insulation film exposed by formation of the trench in the step (d); and the impurity introduced is nitrogen.

Preferably, according to a ninth aspect of the present invention, in the method of the eighth aspect, the step (d) is performed by ion-implanting the nitrogen at an energy of 5 to 30 keV and at a dose of $5 \times 10^{13}$ to $5 \times 10^{15}/cm^2$.

A tenth aspect of the present invention is intended for a method of manufacturing a semiconductor device. According to the present invention, the method comprises the steps of: (a) forming an insulation film containing a fluorine atom on an underlying layer; (b) selectively removing the insulation film until the underlying layer is exposed to form a trench; (c) releasing from the insulation film the fluorine atom contained in part of the insulation film which is near a side surface thereof exposed by formation of the trench; (d) forming a barrier metal on the side surface of the insulation film and an upper surface of the underlying layer which are exposed by the formation of the trench, the step (d) being performed after the step (c); (e) forming a metal film on the barrier metal; and (f) polishing away the metal film until the upper surface of the insulation film is exposed.

Preferably, according to an eleventh aspect of the present invention, in the method of the tenth aspect, the step (c) is performed by heat-treating a structure resulting from the step (b).

A twelfth aspect of the present invention is intended for a semiconductor device manufactured by the method of any one of the first to eleventh aspects.

In the method of the first aspect, when the metal film is polished away in the step (d), the surface of the noble gas atom containing layer is covered with noble gas atoms with a certain surface density. This suppresses an etching reaction between the atoms constituting the noble gas atom containing layer and a polishing agent. Therefore, the polishing is easily stopped at the point of time at which the upper surface of the insulation film is exposed.

The method of the second aspect, unlike a process for introducing noble gas atoms by ion implantation, can avoid the occurrence of radiation damage in the insulation film.

In the method of the third aspect, the release of the fluorine atom contained in the insulation film near the side surface thereof prevents the fluorine atom from moving into the barrier metal. Therefore, the removal of the insulation film and the barrier metal from each other is avoided.

In the method of the fourth aspect, the fluorine atom contained in the insulation film is released from the insulation film by a simple heat treatment process. hi the method of the fifth aspect, if an oxide of metal is formed by natural oxidation in the upper surface of the first metal interconnect line, the introduction of the impurity in the step (d) can destroy the oxide of metal. Therefore, the oxide of metal is easily removed when the upper surface of the first metal interconnect line is cleaned in the step (e).

The method of the sixth aspect can effectively destroy the oxide of metal formed in the upper surface of the first metal interconnect line.

The method of the seventh aspect can improve intimate contact between the second metal interconnect line and the second insulation film.

The method of the eighth aspect can improve intimate contact between the second metal interconnect line and the second insulation film. Additionally, the method of the eighth aspect can prevent a metal atom constituting the second metal interconnect line from moving into the second insulation film and prevent an atom contained in the second insulation film from moving into the second metal interconnect line.

The method of the ninth aspect can effectively destroy the oxide of metal formed in the upper surface of the first metal interconnect line.

In the method of the tenth aspect, the release of the fluorine atom contained in the insulation film near the side surface thereof prevents the fluorine atom from moving into the barrier metal. Therefore, the removal of the insulation film and the barrier metal from each other is avoided.

In the method of the eleventh aspect, the fluorine atom contained in the insulation film is released from the insulation film by a simple heat treatment process.

In accordance with the twelfth aspect, the semiconductor device which is short in delay time and high in operating speed is accomplished since a wiring capacitance between adjacent interconnect lines is reduced.

It is therefore an object of the present invention to overcome the first problem by providing a method of manufacturing a semiconductor device which can avoid the use of a silicon oxynitride film having a high relative dielectric constant as a film for preventing polishing of an FSG film while ensuring resistance to polishing of a metal film by a CMP process, thereby to reduce a wiring capacitance between adjacent interconnect lines.

It is another object of the present invention to overcome the second problem by providing a method of manufacturing a semiconductor device having a multi-level interconnection structure which can suitably remove an oxide of metal present in an upper surface of a lower-level interconnect line before the step of forming an upper-level interconnect line, thereby to reduce an interface resistance and a wiring resistance.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 through 6 are cross-sectional views showing a method of manufacturing a semiconductor device in a step-by-step manner according to a first preferred embodiment of the present invention;

FIG. 23 is a graph showing variations in wiring capacitance when the thickness of a silicon oxynitride film takes on various values;

FIG. 24 is a graph showing variations in wiring capacitance when the relative dielectric constant of the silicon oxynitride film takes on various values.

DESCRIPTION OF THE PREFERRED EMBODIMENTS

First Preferred Embodiment

Figure 4:
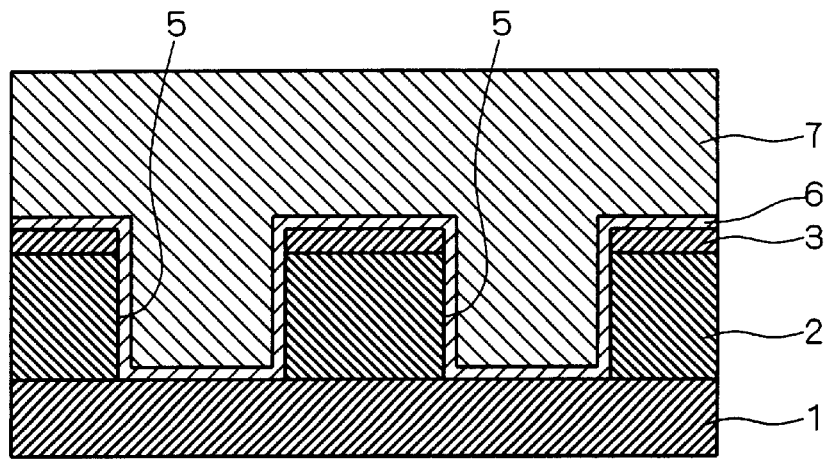

FIGS. 1 through 6 are cross-sectional views showing a method of manufacturing a semiconductor device in a step-by-step manner according to a first preferred embodiment of the present invention. The method according to the first preferred embodiment is intended to manufacture a semiconductor device having multiple levels of copper interconnect lines as described with respect to the background art. FIGS. 1 through 6 show a method of forming a single unit of an interconnect layer in such a semiconductor device. A process for forming a semiconductor device lying under a TEOS film 1 according to the first preferred embodiment is similar to that of the background art, and the description thereon will be omitted herein. Accordingly, a semiconductor substrate, a MOS transistor, an isolating insulation film, an interlayer insulation film and the like which are actually present under the TEOS film 1 are not shown in FIGS. 1 through 6.

First, the TEOS film 1 is formed by a CVD process or the like. Next, an insulation film (an FSG film 2 herein) having a relative dielectric constant lower than that of the TEOS film 1 is formed on the TEOS film 1 by a CVD or PVD process (FIG. 1).

The CVD or PVD of the FSG film 2 is continued so that noble gas atoms (helium, neon, argon, krypton, xenon or radon) are introduced into the FSG film 2 to form a noble gas atom containing layer 3 which is the FSG film containing the noble gas atoms (FIG. 2). The concentration of the noble gas atoms in the noble gas atom containing layer 3 may be controlled by adjusting the temperature, partial pressure and flow rate of the noble gas, and is about $10^{18}$ to $10^{21}/cm^3$.

The noble gas atoms form no chemical bond with an atom constituting the FSG film 2. Further, since the noble gas atoms themselves are hardly polarized, the simple substance of the noble gas atoms has a relative dielectric constant of about 1. New polarization hardly occurs without large radiation damage in the noble gas atom containing layer 3 or the FSG film 2. Therefore, the relative dielectric constant of the noble gas atom containing layer 3 formed by introducing the noble gas atoms into the FSG film is substantially the same as that of the FSG film 2. Further, the noble gas atoms which are insulative do not degrade the insulating property of the FSG film serving as part of the interlayer insulation film.

Next, a photoresist 4 having a predetermined opening pattern is formed on the noble gas atom containing layer 3 by a photolithographic process. Using the photoresist 4 as a mask, an anisotropic dry etching process which exhibits a higher etch rate in a depth direction is performed to etch the noble gas atom containing layer 3 and the FSG film 2 in the order named, exposing an upper surface of the TEOS film 1. As a result, trenches 5 are formed each of which includes a side surface constructed of the noble gas atom containing layer 3 and the FSG film 2 and a bottom surface constructed of the TEOS film 1, and has a depth equal to the sum of the thicknesses of the noble gas atom containing layer 3 and the FSG film 2 (FIG. 3).

The photoresist 4 is then removed. Thereafter, heat treatment by a RTA (Rapid Thermal Anneal) process or heat treatment using a diffusion furnace is performed to release fluorine contained in part of the FSG film 2 which is near the side surface thereof exposed by the formation of the trenches 5 from the FSG film 2 to the outside. The heat treatment may be performed in an oxidizing or non-oxidizing atmosphere. As a result of the heat treatment, the concentration of fluorine is lower near the side surface of the FSG film 2 than in the inside of the FSG film 2.

A barrier metal 6 is formed on the side and bottom surfaces of the trenches 5 and on an upper surface of the noble gas atom containing layer 3 by a sputtering process or the like. The material of the barrier metal 6 is Ta, TaN, TiN, WN, $TaN_xC_y$, $TiN_xC_y$, $WN_xC_y$, $TaN_xF_y$, $TiN_xF_y$, $WN_xF_y$, TiW, TaW or the like where x and y represent a compositional ratio between atoms constituting a molecule. Then, a copper film 7 is formed on an entire surface of a resultant structure by an electroplating or CVD process. The copper film 7 fills the trenches 5 and has an upper surface which is above the upper surface of the noble gas atom containing layer 3 (FIG. 4).

Figure 5:
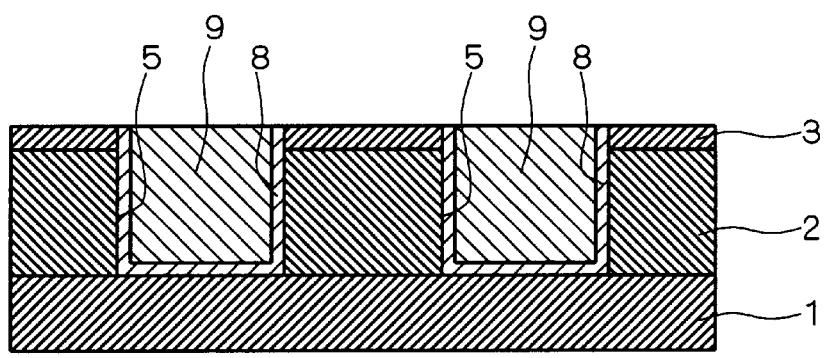

Next, the copper film 7 and the barrier metal 6 are polished away in the order named by a CMP process until the upper surface of the noble gas atom containing layer 3 is exposed. Parts of the copper film 7 which are left unpolished become copper interconnect lines 9 filling the trenches 5. Parts of the barrier metal 6 which are left unpolished become barrier metals 8 (FIG. 5).

Since the noble gas atoms are introduced in the noble gas atom containing layer 3, the polishing rate of the noble gas atom containing layer 3 is lower than that of the FSG film for the reason described below. When a raised part of copper exposed by mechanically removing a raised part of a CuO film by polishing using a polishing cloth reacts with a polishing agent and thereby is etched away, the surface of the noble gas atom containing layer 3 exposed at the same time is covered with noble gas atoms with a certain surface density. This suppresses the etching reaction between the atoms constituting the noble gas atom containing layer 3 and the polishing agent. Therefore, the polishing is easily stopped at the point of time at which the upper surface of the noble gas atom containing layer 3 is exposed, whereby the FSG film 2 is prevented from being polished.

Figure 6:
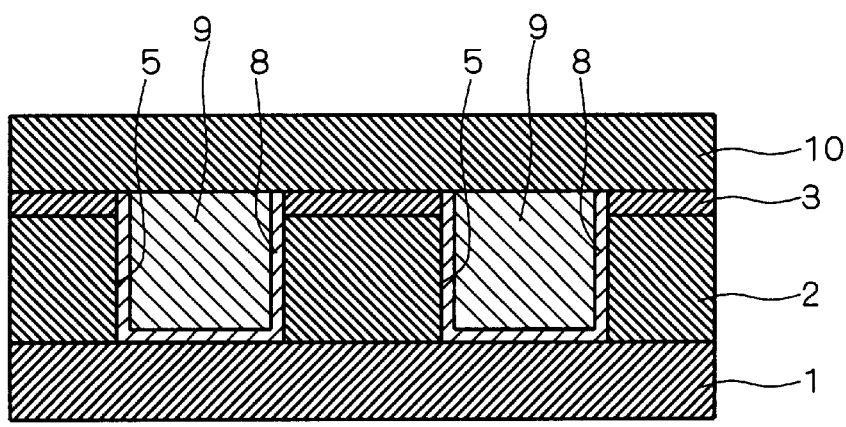

Next, a silicon nitride film 10 is formed on an entire surface of a resultant structure to prevent the oxidation of an upper surface of the copper interconnect lines 9 (FIG. 6).

Alternatively, a silicon oxynitride film or a silicon carbide (SiC) film may be formed in place of the silicon nitride film 10.

As described hereinabove, the method of manufacturing the semiconductor device according to the first preferred embodiment uses the noble gas atom containing layer 3 formed by introducing the noble gas atoms into the FSG film functions as the film for preventing polishing, unlike the background art method in which the silicon oxynitride film 125 is formed as the film for preventing polishing of the FSG film 124. This eliminates the need to use the silicon oxynitride film having a high relative dielectric constant as part of the interlayer insulation film, thereby to reduce the wiring capacitance between the adjacent copper interconnect lines 9. Consequently, a semiconductor integrated circuit which is short in delay time and high in operating speed is accomplished.

Further, the release of fluorine, by heat treatment, which is contained in the FSG film 2 near the side surface thereof exposed by the formation of the trenches 5 prevents fluorine atoms from drifting or diffusing into the subsequently formed barrier metals 8 and 6. This avoids a change in compositional ratio in the barrier metals 8 and 6 because of the drifting or diffusing fluorine atoms, and the resultant removal of the barrier metals 8 and 6 from the FSG film 2.

Japanese Patent Application Laid-Open No. P10-242028A (1998) discloses a method of manufacturing a semiconductor device in forming a trench to be filled with a wiring material in an upper surface of an interlayer insulation film. This disclosed method comprises the steps of: (a-1) performing a plasma process upon the surface of the interlayer insulation film under predetermined sputter-etch conditions using an argon gas or (a-2) implanting argon ions into the surface of the interlayer insulation film; (b) forming a photoresist having a predetermined opening pattern on the surface of the interlayer insulation film after the step (a-1) or (a-2); and (c) etching the interlayer insulation film, using the formed photoresist as a mask. It is also disclosed in this application that the surface of the interlayer insulation film is modified by such processing to provide satisfactory intimate contact with a photoresist material.

However, this method causes a defect such as radiation damage and the like in the surface of the interlayer insulation film to present the disadvantages of degrading the insulating property of the interlayer insulation film and of increasing the polishing rate of the interlayer insulation film during the polishing of the copper film by a CMP process to make the upper surface of the copper interconnect line uneven.

On the other hand, the method of the first preferred embodiment, in which the noble gas atom containing layer 3 is formed by the CVD or PVD process, causes no radiation damage to eliminate the above described disadvantages.

Second Preferred Embodiment

FIGS. 7 through 14 are cross-sectional views showing a method of manufacturing a semiconductor device in a step-by-step manner according to a second preferred embodiment of the present invention. The semiconductor substrate, the MOS transistor, the isolating insulation film, the interlayer insulation film and the like which are actually present under the TEOS film 1 are not shown also in FIGS. 7 through 14 as well as in FIGS. 1 through 6.

Figure 7:
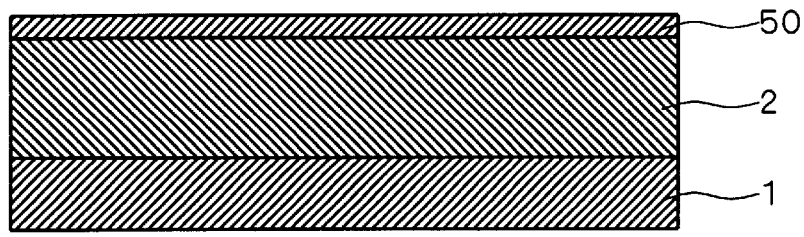
FIGS. 7 through 14 are cross-sectional views showing a method of manufacturing a semiconductor device in a step-by-step manner according to a second preferred embodiment of the present invention.

First, the TEOS film 1, the FSG film 2 and a silicon oxynitride film 50 are formed in the order named by a CVD or PVD process (FIG. 7). Alternatively, the noble gas atom containing layer 3 as described in the first preferred embodiment or a silicon carbide (SiC) film may be formed in place of the silicon oxynitride film 50.

Figure 8:
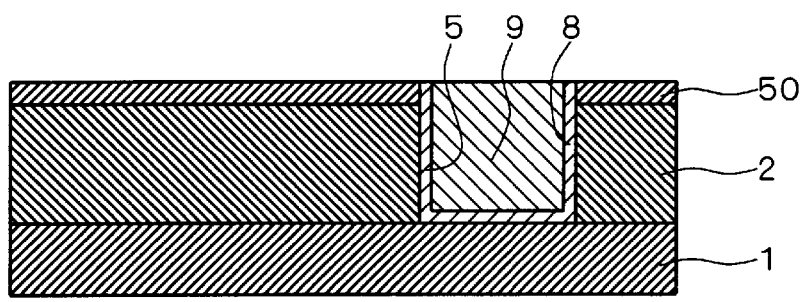

Next, a photoresist having a predetermined opening pattern is formed on the silicon oxynitride film 50. Using the photoresist as a mask, an anisotropic dry etching process is performed to etch the silicon oxynitride film 50 and the FSG film 2 in the order named, thereby forming the trench 5. The photoresist is then removed. Thereafter, a copper film deposited on an entire surface of a resultant structure is polished by a CMP process to form the barrier metal 8 and the copper interconnect line 9 which fill the trench 5 (FIG. 8).

Figure 9:
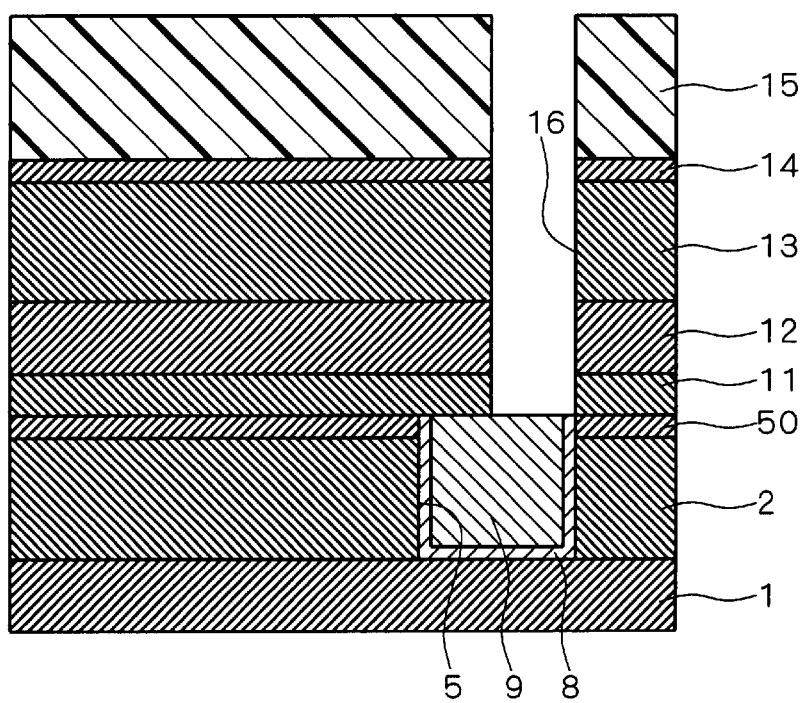

Next, a silicon nitride film 11, a TEOS film 12, an FSG film 13 and a silicon oxynitride film 14 are formed in the order named on an entire surface of a resultant structure by a CVD or PVD process. Then, a photoresist 15 having a predetermined opening pattern is formed on the silicon oxynitride film 14. Using the photoresist 15 as a mask, an anisotropic dry etching process which exhibits a higher etch rate in a depth direction is performed to etch the silicon oxynitride film 14, the FSG film 13, the TEOS film 12 and the silicon nitride film 11 in the order named until the upper surface of the copper interconnect line 9 is exposed, thereby forming a contact hole 16 (FIG. 9).

Figure 10:
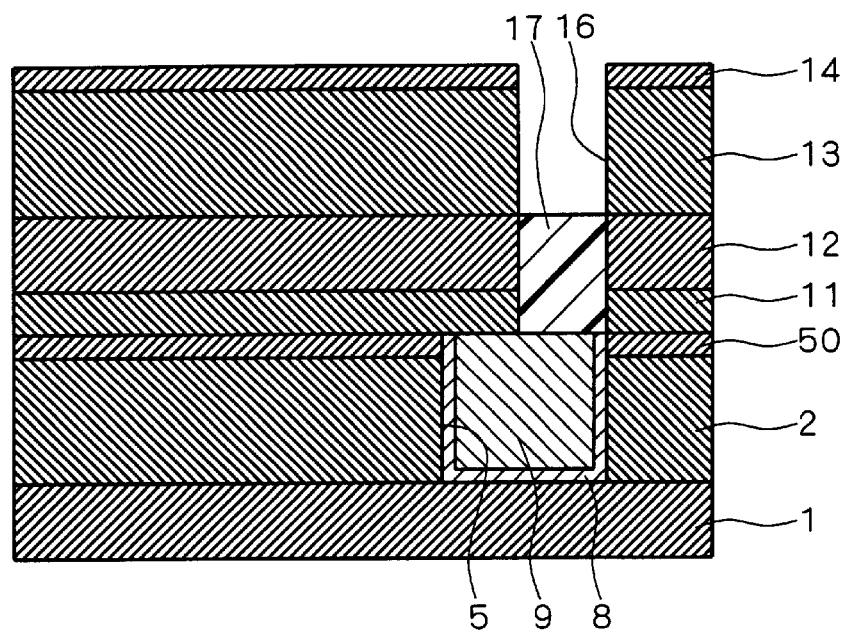

The photoresist 15 is then removed. Thereafter, an organic plug 17 is formed in the contact hole 16 by spin coating (FIG. 10). An example of the organic plug 17 is a chemical amplification resist for use as a resist for KrF or ArF. At this time, the thickness of the organic plug 17 is adjusted so that an upper surface of the organic plug 17 is approximately level with an upper surface of the TEOS film 12.

Next, a photoresist 18 having a predetermined opening pattern is formed on the silicon oxynitride film 14. Using the photoresist 18 as a mask, an anisotropic dry etching process which exhibits a higher etch rate in a depth direction is performed to etch the silicon oxynitride film 14 and the FSG film 13 in the order named until the upper surface of the TEOS film 12 is exposed, thereby forming trenches 19 and 20. In this step, since the organic plug 17 is formed in the bottom of the contact hole 16, the copper interconnect line 9 is not etched by the anisotropic dry etching process. The organic plug 17 is then removed to expose the upper surface of the copper interconnect line 9.

Figure 11:
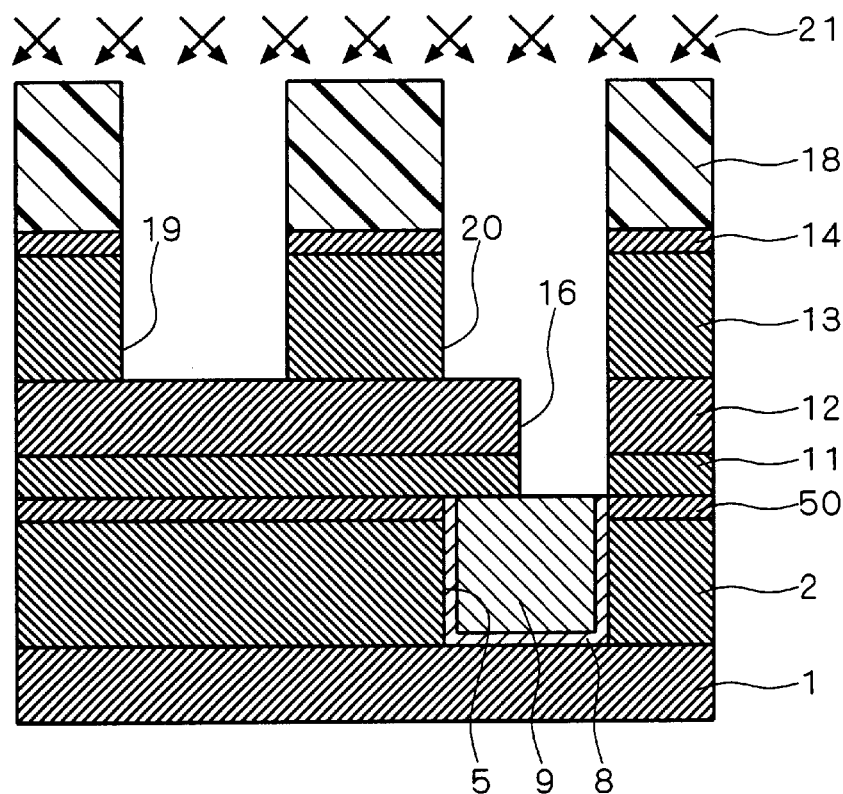
Figure 12:
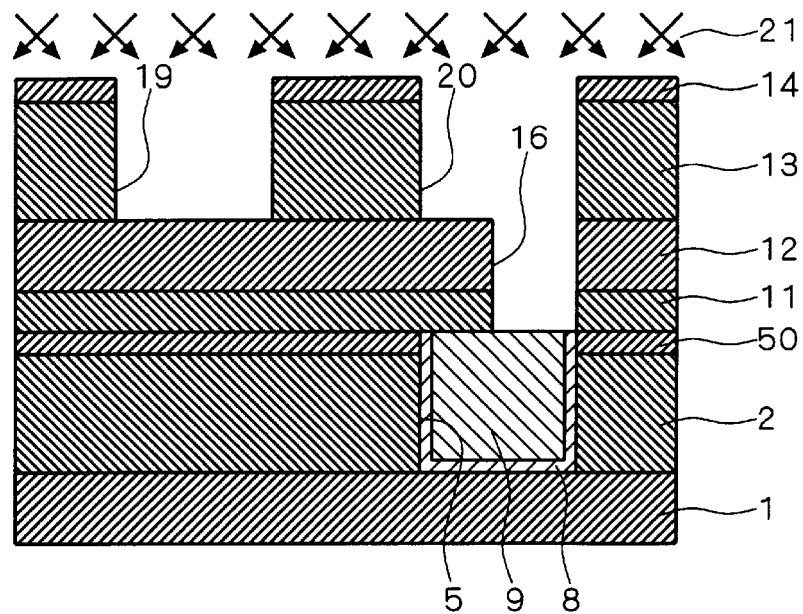

Impurities (noble gas atoms such as argon ions 21 herein) are implanted by an ion implantation process at an energy on the order of 5 to 30 keV and at a dose on the order of $1 \times 10^{13}$ to $1 \times 10^{15}/cm^2$ (FIG. 11). This ion implantation may be fixed implantation at an incident angle of 0° to 9° or oblique-rotating ion implantation at an incident angle of about 0° to about 45°. If an oxide of copper such as CuO is formed in the upper surface of the copper interconnect line 9, this impurity ion implantation destroys the oxide of copper. Alternatively, nitrogen, silicon, oxygen or ozone may be implanted in place of the noble gas atoms to produce a similar effect and, in addition, to improve the intimate contact between a barrier metal 22 to be formed in a later step and the insulation films (the silicon nitride film 11, the TEOS film 12, the FSG film 13 and the silicon oxynitride film 14). Further, the introduction of nitrogen also into the side surface by oblique-rotating ion implantation prevents copper atoms constituting copper interconnect lines 25 and 28 to be formed later from diffusing into the interlayer insulation films such as the TEOS film 12 and the FSG film 13, and prevents fluorine present near a side surface of the FSG film 13 from drifting or diffusing into the barrier metal 22. The nitrogen is implanted at an energy on the order of 5 to 30 keV and at a dose on the order of $5 \times 10^{13}$ to $5 \times 10^{15}/cm^2$.

Figure 18:
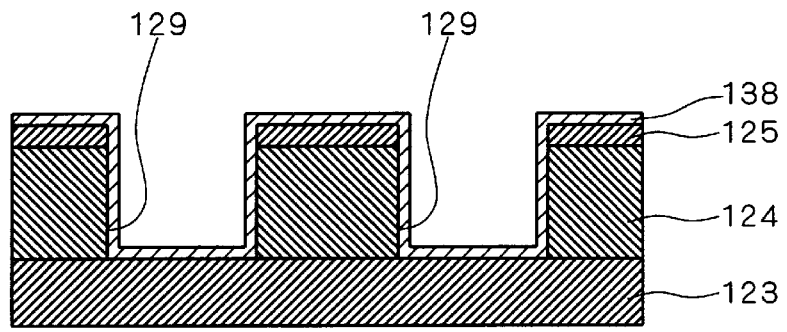
Figure 19:
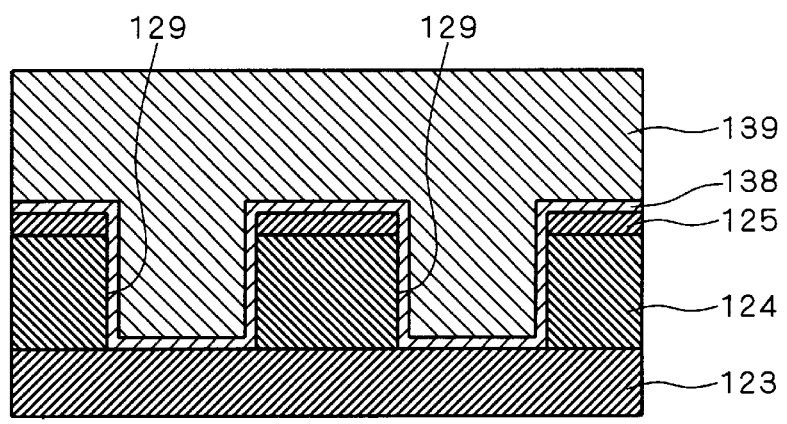
Figure 20:
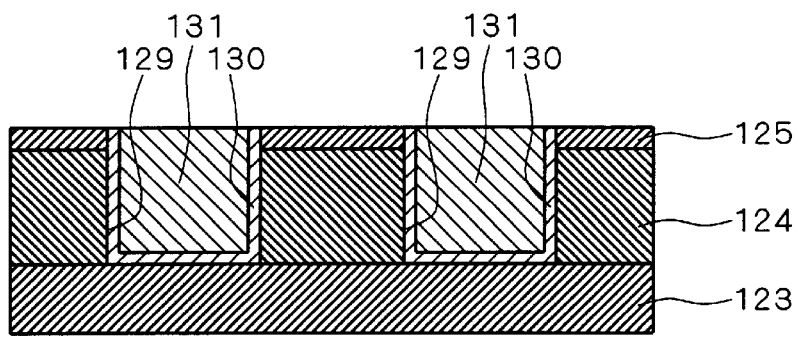
Figure 21:
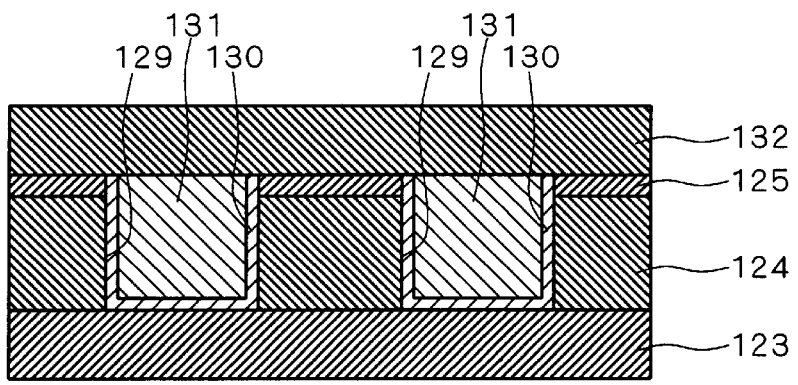
Figure 22:
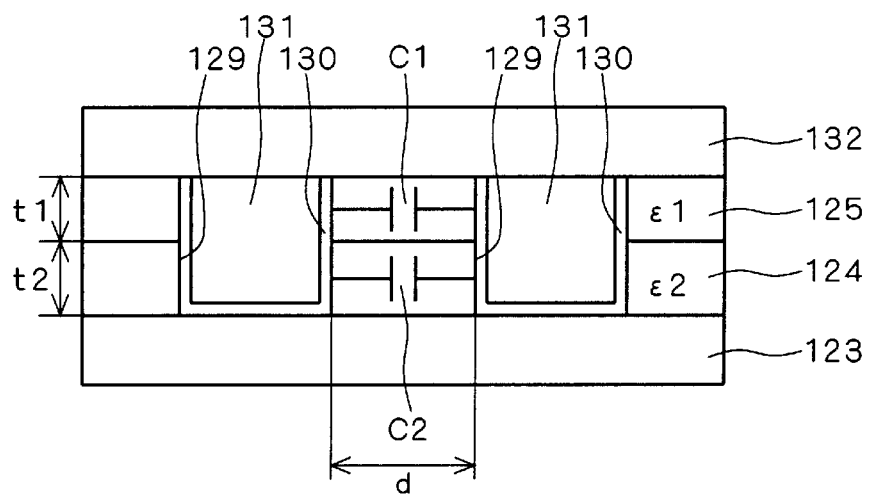
FIG. 22 is a schematic view for illustrating a wiring capacitance between two adjacent interconnect lines in the same interconnect layer.
Figure 25:
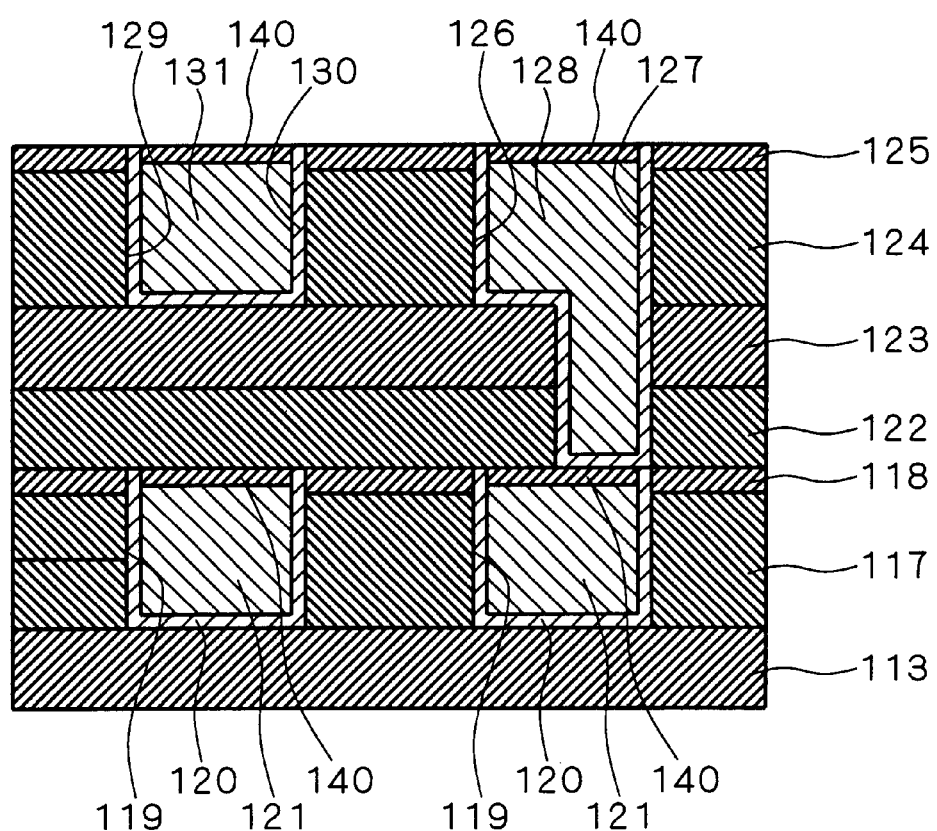
FIG. 25 is a cross-sectional view of a semiconductor device manufactured by the background art semiconductor device manufacturing method.

Although the impurity ion implantation is performed before the removal of the photoresist 18 in FIG. 11, the ion implantation may be performed after the removal of the photoresist 18 as shown in FIG. 18. The impurity introduction may be performed by a plasma doping process or by forming a low-temperature high-pressure atmosphere in a furnace (a low-temperature high-pressure annealing process), rather than by the ion implantation process, thereby to produce a similar effect.

Figure 13:
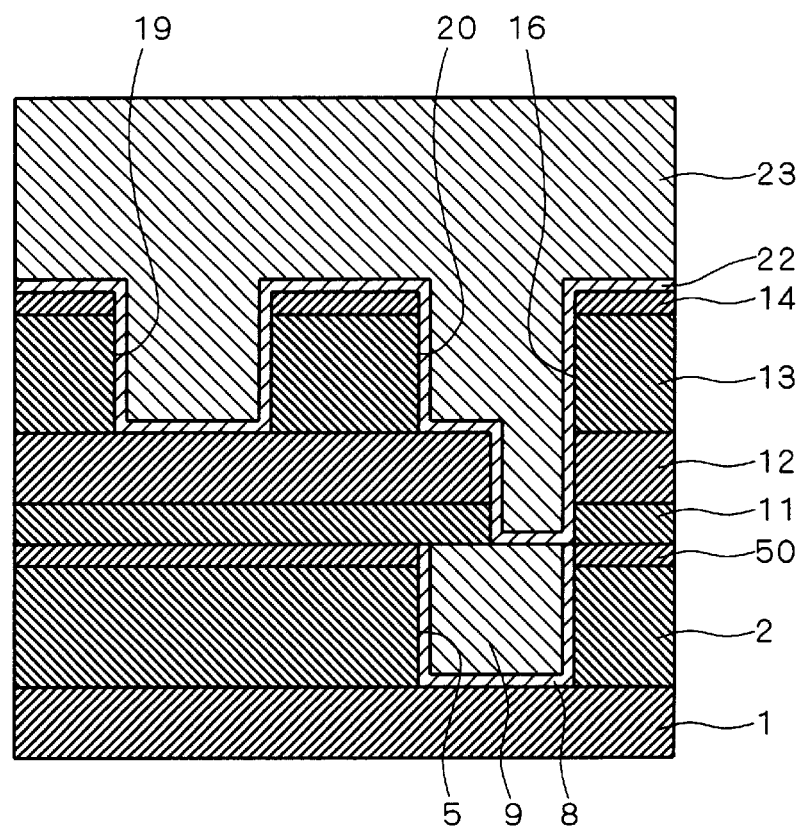

The oxide of copper destroyed by the impurity introduction is removed by dry etch cleaning using a mixture of noble gas and hydrogen gas. The photoresist 18 is then removed. Thereafter, the barrier metal 22 is formed by a sputtering process or the like. Then, a copper film 23 is formed on an entire surface of a resultant structure by an electroplating or CVD process (FIG. 13).

Since the sputtering process is anisotropic, a sputtered material is prone to be deposited on a bottom surface but is not prone to be deposited on a side surface. It is desirable to thicken the barrier metal 22 in order to prevent the copper atoms from moving into the interlayer insulation film. However, the barrier metal 22 which is too thick is disadvantageous in decreasing the cross-sectional area of the copper interconnect lines 25 and 28 to be formed later to increase the wiring resistance of the copper interconnect lines 25 and 28. Thus, the barrier metal 22 is not allowed to be too thick in order that the wiring resistance of the copper interconnect lines 25 and 28 is held low. However, the introduction of nitrogen as the impurity in the steps shown in FIGS. 11 and 12 suitably prevents the copper atoms from moving into the interlayer insulation film while the wiring resistance of the copper interconnect lines 25 and 28 is held low. A similar effect is produced when a shallow nitrogen doped layer having a high concentration is formed by a plasma doping process.

Figure 14:
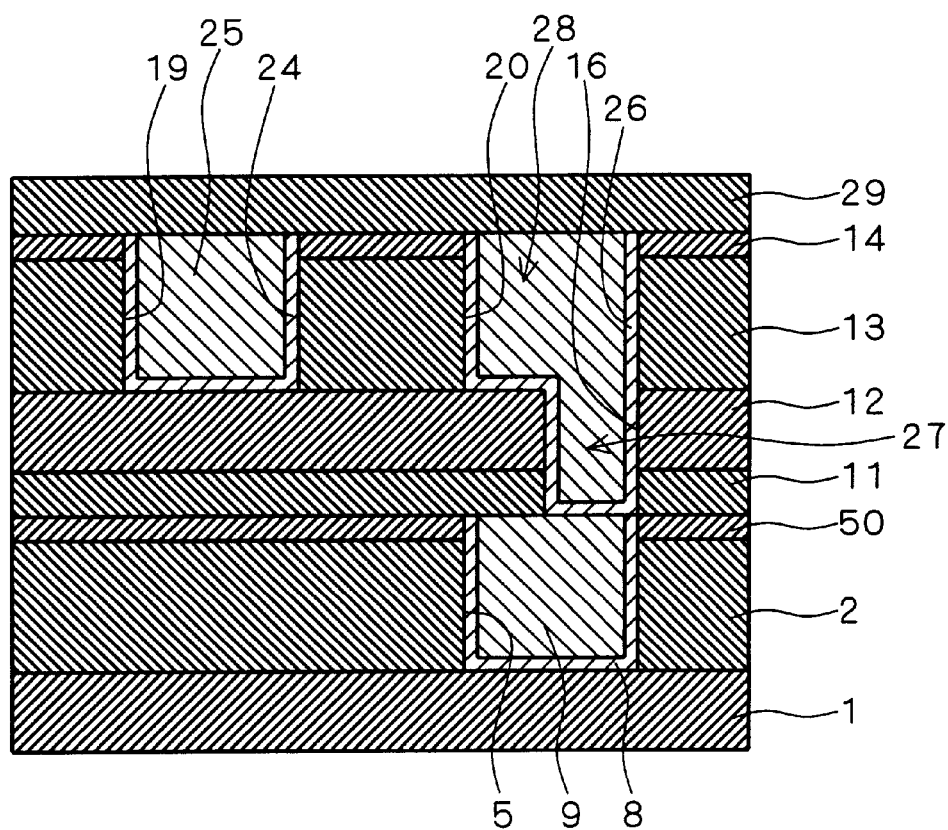
Figure 15:
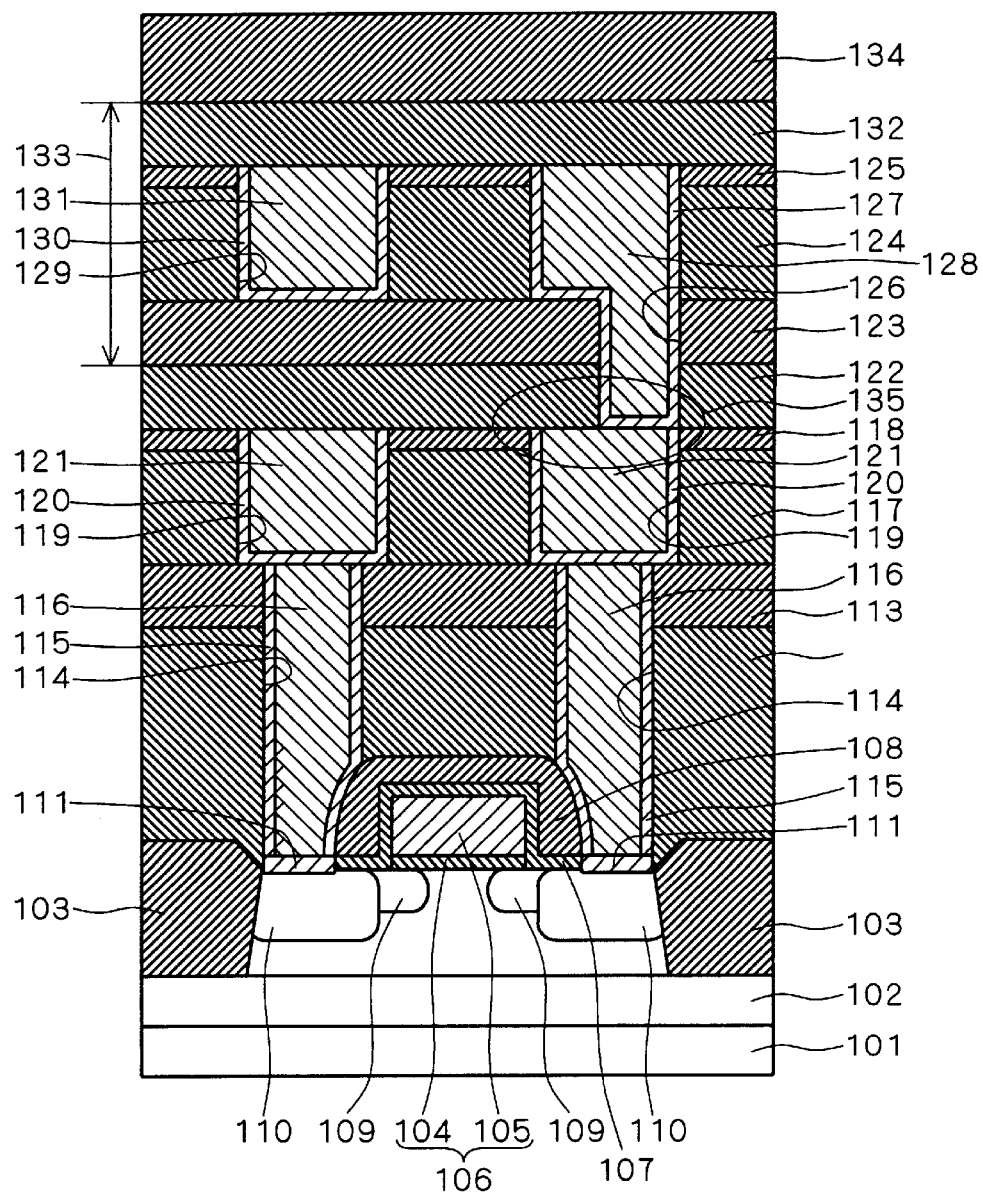
FIG. 15 is a cross-sectional view of a background art semiconductor device.
Figure 16:
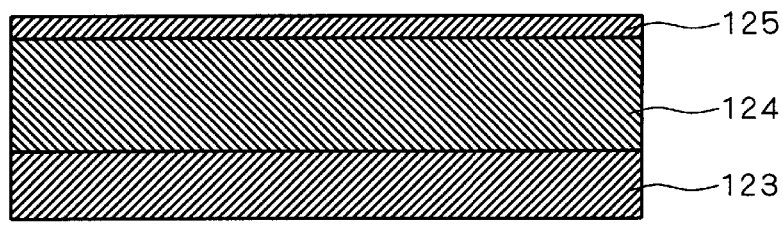
FIGS. 16 through 21 are cross-sectional views showing a background art method of manufacturing a semiconductor device in a step-by-step manner.
Figure 17:
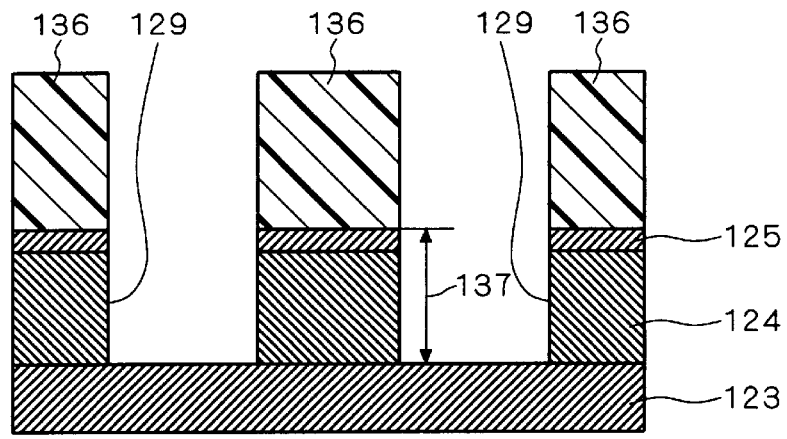

Next, the copper film 23 and the barrier metal 22 are polished away in the order named by a CMP process until an upper surface of the silicon oxynitride film 14 is exposed. Parts of the copper film 23 which are left unpolished become the copper interconnect lines 25 and 28 filling the trenches 19 and 20. Parts of the barrier metal 22 which are left unpolished become barrier metals 24 and 26. Then, a silicon nitride film 29 is formed on an entire surface of a resultant structure to prevent the oxidation of an upper surface of the copper interconnect lines 25 and 28 (FIG. 14). The above described steps in which the copper interconnect line 28 and a copper plug 27 are formed simultaneously are referred to as a dual damascene process.

In the method of manufacturing the semiconductor device according to the second preferred embodiment, as described hereinabove, the impurities are introduced to destroy the oxide of copper formed in the upper surface of the lower-level interconnect line. Therefore, the method of the second preferred embodiment can easily remove the oxide of copper by cleaning away the oxide of copper before the formation of the upper-level interconnect lines, as compared with the background art method of manufacturing the semiconductor device which does not comprises the step of destroying the oxide of copper.

In the first and second preferred embodiments, the FSG film is used as an insulation film having a low relative dielectric constant. However, other insulation films having a relatively low relative dielectric constant may be used in place of the FSG film. For example, silicon oxyfluoride, hydrogen silsesquioxane (HSQ), fluorinated polysilicon, poly-phenylquinoxaline polymer, fluoro-polymide, amorphous fluoro carbon (a-C:F), methyl-poly-siloxane (MPS), poly arylene ether (PAE), or the like may be used. Alternatively, a gas having a low dielectric constant, such as air, may be used.

Although the copper interconnect lines are formed as an example of metal interconnect lines in the first and second preferred embodiments, the present invention is also effective when other metals such as gold, silver, aluminum, tungsten, platinum, nickel, zirconium and the like, a metal alloy, or a metal silicide are formed.

While the invention has been described in detail, the foregoing description is in all aspects illustrative and not restrictive. It is understood that numerous other modifications and variations can be devised without departing from the scope of the invention.

What is claimed is:

1. A method of manufacturing a semiconductor device, comprising the steps of:
    (a) forming an insulation film on an underlying layer, said insulation film including a noble gas atom containing layer in an upper surface thereof, said noble gas atom containing layer containing a noble gas atom;
    (b) selectively removing said insulation film until said underlying layer is exposed to form a trench;
    (c) forming a metal film on a structure resulting from said step (b); and
    (d) polishing away said metal film until said upper surface of said insulation film is exposed.

2. The method according to claim 1,
    wherein said insulation film is formed by deposition in said step (a); and
    wherein said noble gas atom containing layer is formed by introducing said noble gas atom into said insulation film during the deposition of said insulation film.

3. The method according to claim 1,
    wherein said noble gas atom is selected from the group consisting of helium, neon, argon, krypton, xenon and radon.

4. The method according to claim 1,
    wherein said insulation film contains a fluorine atom,
    said method further comprising the steps of:
    (e) releasing from said insulation film said fluorine atom contained in part of said insulation film which is near a side surface thereof exposed by formation of said trench, said step (e) being performed between said steps (b) and (c); and
    (f) forming a barrier metal on said side surface of said insulation film and an upper surface of said underlying layer which are exposed by the formation of said trench, said step (f) being performed between said steps (e) and (c),
    wherein said metal film is formed on said barrier metal in said step (c).

5. The method according to claim 4,
    wherein said step (e) is performed by heat-treating a structure resulting from said step (b).

6. A method of manufacturing a semiconductor device, comprising the steps of:
    (a) selectively forming a first metal interconnect line in an upper surface of a first insulation film;
    (b) forming a second insulation film on said first insulation film;
    (c) selectively trenching an upper surface of said second insulation film to form a trench, thereby exposing an upper surface of said first metal interconnect line;
    (d) introducing an impurity into said upper surface of said first metal interconnect line;

(e) cleaning said upper surface of said first metal interconnect line, said step (e) being subsequent to said step (d);

(f) forming a metal film on a structure resulting from said step (e); and (g) polishing away said metal film until said upper surface of said second insulation film is exposed to form a second metal interconnect line.

7. The method according to claim 6, wherein said impurity is introduced by any one of ion implantation, plasma doping and low-temperature high-pressure annealing processes in said step (d).

8. The method according to claim 6, wherein said impurity includes noble gas atoms; and wherein said step (d) is performed by ion-implanting said noble gas atoms at an energy of 5 to 30 keV and at a dose of $1 \times 10^{13}$ to $1 \times 10^{15}/cm^2$.

9. The method according to claim 6, wherein said impurity is introduced also into a side surface of said second insulation film exposed by formation of said trench in said step (d); and wherein said impurity introduced is selected from the group consisting of silicon, oxygen and ozone.

10. The method according to claim 6, wherein said impurity is introduced also into a side surface of said second insulation film exposed by formation of said trench in said step (d); and wherein said impurity introduced is nitrogen.

11. The method according to claim 10, wherein said step (d) is performed by ion-implanting said nitrogen at an energy of 5 to 30 eV and at a dose of $5 \times 10^{13}$ to $5 \times 10^{15}/cm^2$.

12. A method of manufacturing a semiconductor device, comprising the steps of:

(a) forming an insulation film containing a fluorine atom on an underlying layer;

(b) selectively removing said insulation film until said underlying layer is exposed to form a trench;

(c) releasing from said insulation film said fluorine atom contained in part of said insulation film which is near a side surface thereof exposed by formation of said trench;

(d) forming a barrier metal on said side surface of said insulation film and an upper surface of said underlying layer which are exposed by the formation of said trench, said step (d) being performed after said step (c);

(e) forming a metal film on said barrier metal; and (f) polishing away said metal film until said upper surface of said insulation film is exposed.

13. The method according to claim 12, wherein said step (c) is performed by heat-treating a structure resulting from said step (b).

* * * * *